(12) United States Patent
Bolle et al.

(10) Patent No.: US 6,912,081 B2
(45) Date of Patent: Jun. 28, 2005

(54) OPTICAL MICRO-ELECTROMECHANICAL SYSTEMS (MEMS) DEVICES AND METHODS OF MAKING SAME

(75) Inventors: Cristian A Bolle, Bridgewater, NJ (US); Mark Anthony Paczkowski, Andover, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/095,820

(22) Filed: Mar. 12, 2002

(65) Prior Publication Data

US 2003/0174383 A1 Sep. 18, 2003

(51) Int. Cl.$^7$ ............................................. G02B 26/00
(52) U.S. Cl. ........................ 359/295; 430/316; 430/323
(58) Field of Search ................................ 359/222, 224, 359/214, 295, 291, 298, 849, 850; 310/36, 90, 311, 313; 430/311, 313, 314, 316–318, 322–323

(56) References Cited

U.S. PATENT DOCUMENTS

| | | | |
|---|---|---|---|
| 5,495,414 A | 2/1996 | Spangler et al. | 364/424.05 |
| 5,920,417 A * | 7/1999 | Johnson | 359/223 |
| 6,201,631 B1 | 3/2001 | Greywall | 359/245 |
| 6,329,738 B1 * | 12/2001 | Hung et al. | 310/309 |
| 6,472,130 B1 * | 10/2002 | Geyer et al. | 430/331 |
| 6,487,001 B2 * | 11/2002 | Greywall | 359/292 |
| 2001/0021585 A1 * | 9/2001 | Hara | 438/706 |
| 2002/0033048 A1 * | 3/2002 | McIntosh et al. | 73/514.32 |
| 2002/0167072 A1 * | 11/2002 | Andosca | 257/620 |
| 2003/0021004 A1 * | 1/2003 | Cunningham et al. | 359/290 |
| 2003/0080042 A1 * | 5/2003 | Barth et al. | 210/321.84 |

OTHER PUBLICATIONS

Leland 'Chip' Spangler et al., "ISAAC: integrated automotive accelerometer", *Sensors and Actuators A 54*, 1996, pp. 523–529.

* cited by examiner

Primary Examiner—Jordan M. Schwartz
Assistant Examiner—Jessica Stultz
(74) Attorney, Agent, or Firm—Eugene J. Rosenthal

(57) ABSTRACT

An arbitrary gap between the two chips of a MEMS device arranged in a flip-chip arrangement is achieved by etching into a first substrate to form mesas which act as spacers between which, or even on which, any required circuit elements are formed. Points of a layer at a first surface of the second substrate within which MEMS structures are made are bonded to the mesas of the first substrate. The second substrate is then removed, leaving the structures bonded to the mesas. The mesas may be formed by placing a hard mask, such as silicon oxide, which defines the desired pattern of mesas on the first substrate, and then etching the unmasked portion of the substrate using a mixture of potassium hydroxide (KOH) with isopropanol (IPA) or, tetramethyl ammonium hydroxide (TMAH) mixed with a surfactant, e.g., nonylphenol ethoxy ether or other equivalent compounds.

36 Claims, 4 Drawing Sheets

OPTICAL MICRO-ELECTROMECHANICAL SYSTEMS (MEMS) DEVICES AND METHODS OF MAKING SAME

TECHNICAL FIELD

This invention relates to the art of micro-electromechanical systems (MEMS) devices and methods of their making, and more particularly, to arrays of tiltable micro mirrors, e.g., small mirrors, which can reflect light.

BACKGROUND OF THE INVENTION

One solution for all-optical switching employs two MEMS devices each containing an array of tiltable micro mirrors, e.g., small mirrors, which can reflect light, which herein refers to any radiation in the wavelength of interest, whether or not in the visible spectrum. An optical path is established for light supplied from an input source, e.g., an optical fiber, to an output, e.g., an output fiber, by steering the light using a first micro mirror on the first optical MEMS device, the first micro mirror being associated with the input fiber, onto a second micro mirror on the second optical MEMS device which is associated with the output fiber. The second micro mirror then steers the light into the output fiber. Each fiber connected to the system is considered a port of the system, the input fibers being the input ports and the output fibers being the output ports.

There are various prior art methods of making such an array of tiltable micro mirrors. Typically the array is made in two parts. The first part includes the electrodes which control the tilt of the micro mirrors and some type of spacer which holds the second part offset from the electrodes. The second part includes the micro mirrors and their springs and any other supporting structure.

The spacers of one prior art mirror array are made from polyimide, which is photo-patternable type of plastic that is deposited on the substrate. Disadvantageously, such spacers are a) not flat at the top, b) are relatively soft, e.g., compared to silicon, c) must be hard baked at high temperatures, and d) the height of the resulting spacers is not uniform from device to device even when the same processing is employed.

In another prior art arrangement, the micro mirrors are manufactured from a silicon on insulator (SOI) wafer and then portions of the back of the wafer are etched to allow the mirror to move freely. The unetched portions serve as the spacers and keep the micro mirrors elevated with respect to the electrodes which are on a second wafer. See for example U.S. Pat. No. 6,201,631, which is incorporated by reference as if fully set forth herein. However, such micro mirrors are relatively fragile, and the height of the spacers is dictated by the thickness of the wafer on which the micro mirrors were formed, which is typically greater than 200 $\mu$m.

Yet another prior art method creates micro mirrors as suspended structures by depositing a thick sacrificial layer on a substrate, with appropriate patterning to make holes therethrough via etching. Then, a material to form the micro mirrors is conformally deposited on top of the sacrificial layer. The layer for the micro mirrors is patterned, and the micro mirrors are formed. A portion of the conformally deposited mirror material is then etched away to allow access to the sacrificial layer. Finally, the sacrificial layer is removed via etching. This process suffers from the fact that it takes a long time to grow the thick sacrificial layer, and the height of the suspended micro mirrors is typically limited by thickness of the sacrificial layer, so the height is often limited to no more than 5 $\mu$m.

A process similar to that used for making accelerometers as taught in "ISAAC:integrated silicon automotive accelerometer" by Leland 'Chip' Spangler and Christopher J. Kemp, published in Sensors and Actuators A 54 (1996), pages 523–529, which is incorporated by reference as if fully set forth herein, is unsuitable for making arrays of micro mirrors. This is because when using that process it is too hard to control the final thickness of the membrane that would be used for the mirror and other delicate structures, such as springs, which would also be formed from the same membrane.

SUMMARY OF THE INVENTION

I have recognized that MEMS devices with an arbitrary gap between the two chips in a flip-chip arrangement can easily be achieved, in accordance with the principles of the invention, by etching into a first substrate to form mesas which act as the spacers and between which, or even on which, any required circuit elements are formed, e.g., after the mesas are formed. Thereafter, points of a layer at a first surface of the second substrate within which MEMS structures are made are bonded to the mesas of the first substrate. The second substrate is then removed, leaving the structures bonded to the mesas.

In accordance with an aspect of the invention, the mesas may be formed by placing a hard mask, such as silicon oxide, which defines the desired pattern of mesas on the first substrate, and then etching the unmasked portion of the substrate using an anisotropic etchant, such as a mixture of potassium hydroxide (KOH) with isopropanol (IPA). In accordance with another aspect of the invention, since KOH and IPA are incompatible with complementary metal oxide semiconductor (CMOS) type processes, in lieu of using KOH and IPA, tetramethyl ammonium hydroxide (TMAH) mixed with a surfactant, e.g., nonylphenol ethoxy ether or other equivalent compounds, which is compatible with CMOS processing, can be used.

In one embodiment of the invention, micro mirrors with an arbitrary gap between the micro mirrors and their respective electrodes can easily be achieved by etching into a first substrate to form mesas which act as spacers between which, or even on which, the electrodes are formed after the mesas are formed. Thereafter, the micro mirrors and their supporting structure, which are made on the surface of a second substrate, are bonded to the mesas of the first substrate. The second substrate is then removed, leaving the micro mirror array bonded to the mesas. The inventive method enables the mesa tops be flat to enable a good bond with the mirror supporting structure. The inventive method also enables the space between the mesas be flat, so that electrodes deposited in the space are flat and have a uniform distance to their respective mirror in its neutral position.

In accordance with an aspect of the invention, various ones of the mesas may be of different sizes. In accordance with another aspect of the invention, various ones of the mesas may be used to implement functionality other than the supporting function of spacing. For example, a) a mesa with a hole in it may be used to seat a ball lens, b) a mesa with V-grooves may be used to seat optical fibers, c) long narrow mesas placed between micro mirrors may function as windbreakers, d) a mesa with a pattern etched into its top, e.g., a fiducial mark, can be used for alignment purposes, and e) the like.

In accordance with another embodiment of the invention, vias may be made through the mesas or through any of the substrate to facilitate the making of electrical connections. In accordance with another aspect of the invention, mesas of different heights can be made by removing the mask which was covering any mesa for which it is desirable that it have less height at a point during the etching process and then resuming etching.

DETAILED DESCRIPTION

Figure 1:
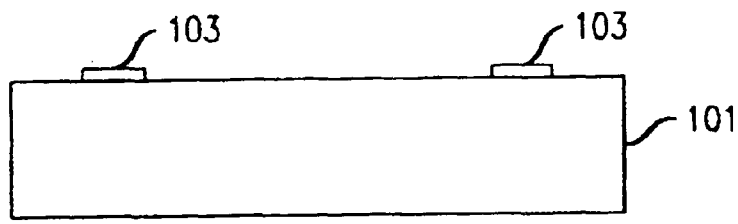
FIG. 1 shows a cross-section of substrate with hard mask forming thereon a pattern of locations at which the mesas will be formed, in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

Additionally, unless otherwise explicitly specified herein, any lens shown and/or described herein is actually an optical system having the particular specified properties of that lens. Such an optical system may be implemented by a single lens element but is not necessarily limited thereto. Similarly, where a mirror is shown and/or described what is actually being shown and/or described is an optical system with the specified properties of such a mirror, which may be implemented by a single mirror element but is not necessarily limited to a single mirror element. This is because, as is well known in the art, various optical systems may provide the same functionality of a single lens element or mirror but in a superior way, e.g., with less distortion. Furthermore, as is well known in the art, the functionality of a curved mirror may be realized via a combination of lenses and micro mirrors and vice versa. Moreover, any arrangement of optical components that are performing a specified function, e.g., an imaging system, gratings, coated elements, and prisms, may be replaced by any other arrangement of optical components that perform the same specified function. Thus, unless otherwise explicitly specified here, all optical elements or systems that are capable of providing specific function within an overall embodiment disclosed herein are equivalent to one another for purposes of the present disclosure.

The term micro-electromechanical systems (MEMS) device as used herein is intended to mean an entire MEMS device or any portion thereof. Thus, if a portion of a MEMS device is inoperative, or if a portion of a MEMS device is occluded, such a MEMS device is nonetheless considered to be a MEMS device for purposes of the present disclosure.

In the description, identically numbered components within different ones of the FIGS. refer to the same components.

Figure 2:
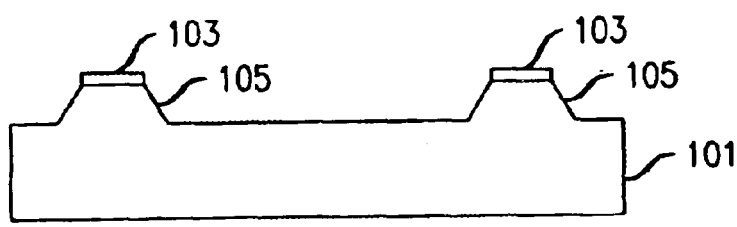
FIG. 2 shows a cross-section of the substrate of FIG. 1 after it has been etched with a wet anisotropic etch.

FIG. 1 shows a cross-section of substrate 101, typically <100>silicon, with hard mask 103, e.g., silicon nitride or silicon oxide ($SiO_2$), forming thereon a pattern of locations at which the silicon will not be etched and consequently at which mesas will be formed, in accordance with the principles of the invention. FIG. 2 shows a cross-section after substrate 101 has been etched with a wet anisotropic etch, e.g., using, in accordance with aspects of the invention, a mixture of potassium hydroxide (KOH) with isopropanol (IPA) or tetramethyl ammonium hydroxide (TMAH) mixed with a surfactant, e.g., nonylphenol ethoxy ether or other equivalent compounds, which is compatible with CMOS processing, as the etchant. As a result of the etching process, mesas 105 are formed, each of which still has hard mask 103 on its upper surface. It is advantageous if the mesa tops are flat, to enable a good bond portion of the second substrate to be bonded thereto, e.g., the mirror support springs. It is also advantageous that the space between the mesas be flat so that any circuit elements, e.g., electrodes, which are deposited in the space are flat. For micro mirrors it is desirable to have a uniform distance between the micro mirrors in their neutral position and their respective electrodes below them. Use of the aforementioned etchants yields mesas of adequate and uniform height while leaving the spaces in between appropriately flat.

Figure 3:
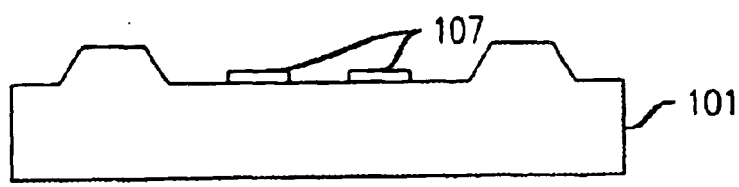
FIG. 3 shows a cross-section of the substrate of FIG. 2 after the hard mask is removed.

FIG. 3 shows a cross-section of substrate 101 after hard mask 103 is removed via an etching step, e.g., using hydrofluoric acid as the etchant if silicon oxide was used as the hard mask. Also shown in FIG. 3 are circuit elements, e.g., electrodes, 107 formed in the valleys between mesas 105. Note that the valleys are the open spaces that were formed as a result of the etching of substrate 101 to form mesas 105. Circuit elements such as electrodes 107 may be formed using essentially conventional techniques for forming such circuit elements on flat substrates. However, due to the topography of the substrate given the presence of mesas 105, when applying photoresist to pattern the electrodes, the photoresist is conformally coated on the wafer, e.g., using a spray coater, onto substrate 101 to form the required conformal coating. Alternatively, the photoresist could be electroplated to form a conformal coating. Other well known techniques for depositing circuit elements on non-flat substrate may be employed to deposit circuit elements on the surfaces of the mesas themselves as well.

Note that for micro mirrors, in addition to electrodes, there is also formed the wiring that is necessary to provide control signals to the electrodes. However, such wiring is not shown in FIG. 3 due to the difficulty of showing such wires. Those of ordinary skill in the art will readily know how to form such wiring, which uses the same techniques as the making of the electrodes. Furthermore, various other active and passive circuit elements may also be formed on substrate 101.

Figure 4:
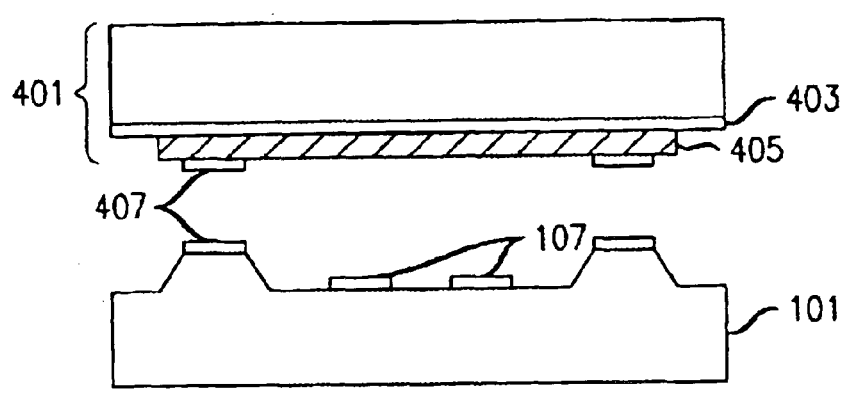
FIG. 4 shows the substrate as it appears in FIG. 3 and also a second substrate which is facing upside down with respect to the first substrate.
Figure 5:
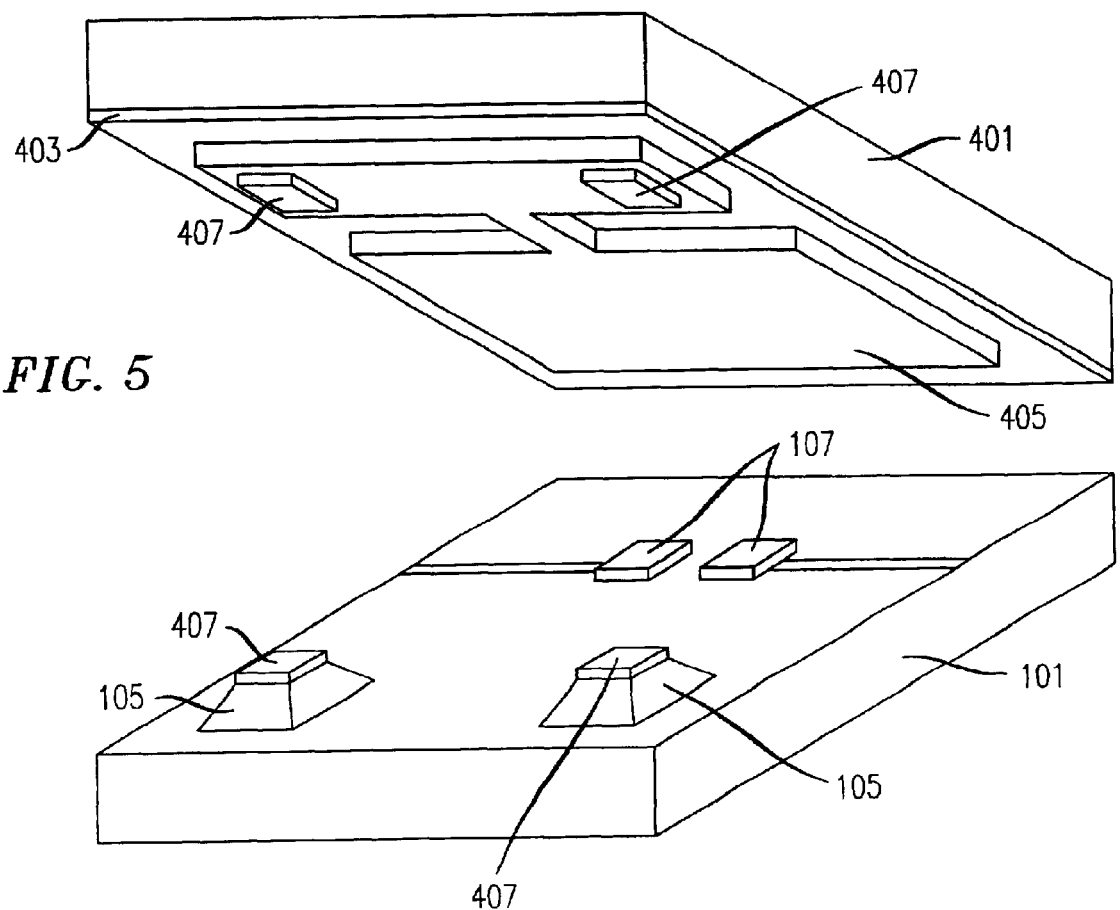
FIG. 5 shows a three-dimensional view of a portion of FIG. 4 in which the part of the micro-electromechanical system that is going to move is a paddle.

FIG. 4 shows substrate 101 as it appears in FIG. 3 and also a second substrate 401 which is facing upside down with respect to substrate 101, but is not yet bonded thereto. Thus, on the "upper" surface of substrate 401, which is facing downward toward substrate 101 because it has been "flipped", is a) sacrificial layer 403, e.g., a deposited layer of silicon dioxide, which will be removed to release those parts which are to move and b) mechanical layer 405, e.g., silicon deposited on sacrificial layer 403, from which is formed those parts of the micro-electromechanical system that is going to move, e.g., the micro mirrors. Mechanical layer 405 could be made of, at least in part, or be coated with, a reflecting material, such as a metal or a reflective dielectric stack. Also shown in FIG. 4 is optional bonding agent 407, e.g., solder, glass, or any other appropriate agent, which will help bond mechanical layer 405 to mesas 105 of substrate 101. FIG. 5 shows a three-dimensional view of a portion of FIG. 4 in which the part of the micro-electromechanical system that is going to move is a paddle formed in mechanical layer 405.

Figure 6:
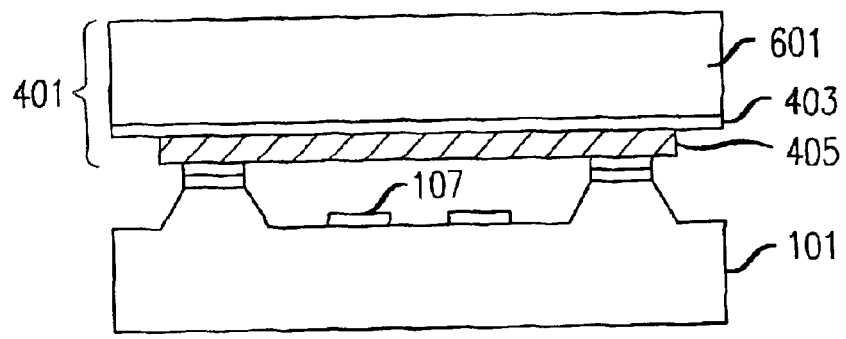
FIG. 6 shows the two substrates of FIG. 4 bonded to each other before removal of the sacrificial layer and the "handle wafer"

FIG. 6 shows substrate 101 bonded to substrate 401 before removal of sacrificial layer 403 and unnecessary portion 601 of substrate 401, which is referred to as the "handle wafer".

Figure 7:
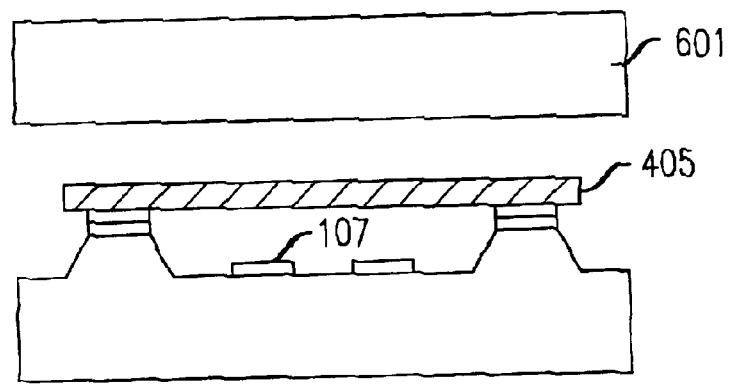
FIG. 7 shows removal of the sacrificial layer.
Figure 8:
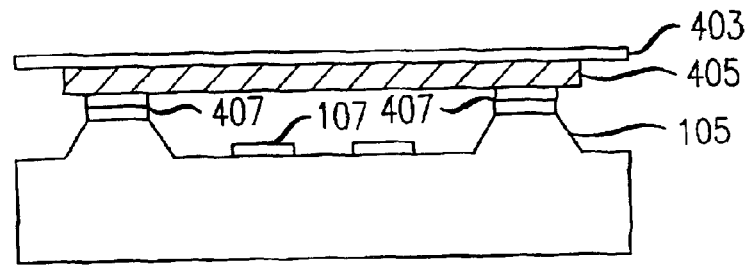
FIG. 8 shows removal of the "handle wafer"

In one embodiment of the invention, sacrificial layer 403 is removed, e.g., via etching, which causes handle wafer 601 to become detached from the remaining structure thereby enabling the moveable parts of mechanical layer 405 to move. This is shown in FIG. 7. In another embodiment of the invention, the handle wafer is first removed via etching. This is shown in FIG. 8. Sacrificial layer 403 is then removed, also via etching, which allows the moveable parts to move. Typically, one etchant is employed to remove the handle wafer and a different etchant is employed to remove the sacrificial layer. A sacrificial layer need not be employed if it is possible to control the etching such that it stops when it reaches mechanical layer 405.

Advantageously, if mechanical layer 405 is not already reflective, well controlled metalization of the moving parts may now be achieved at the surface where the sacrificial layer formerly had been, e.g., using a shadow mask to prevent the metal from coating other parts. Alternatively, the moving part may have been fabricated so as to already have metalization or another reflective material which is exposed upon removal of the sacrificial layer. Further alternatively, a hole or cavity, e.g., the size of the moving parts and at the location of the moving parts, may be drilled through the handle wafer and sacrificial layer through to the moving part layer so that metalization of the moving parts may be achieved through the cavity.

Further advantageously, high density arrays of circular micro mirrors may be formed since the mesas which hold the micro mirrors up are below the micro mirrors, and so the mesas can be located off center from the rows formed by the micro mirrors, i.e., in those gaps formed at the point where three or more neighboring micro mirrors meet if there are two complete adjacent rows or columns of micro mirrors meeting.

Figure 9:
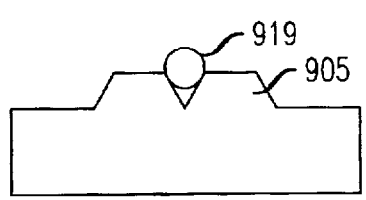
FIG. 9 shows a mesa in which is seated a ball lens, in accordance with an aspect of the invention.
Figure 10:
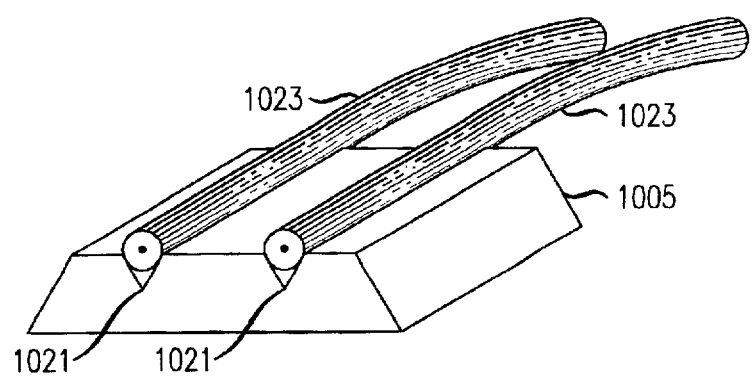
FIG. 10 shows a mesa with V-grooves in respective ones of which are seated optical fibers, in accordance with an aspect of the invention.
Figure 11:
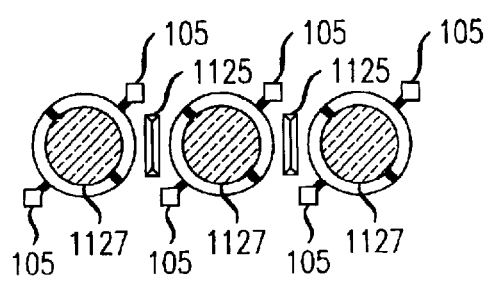
FIG. 11 shows micro mirrors between which have been formed long narrow mesas to function as windbreakers, in accordance with an aspect of the invention.
Figure 12:
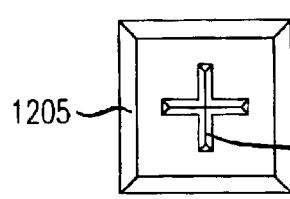
FIG. 12 shows a mesa into which has been etched a pattern which may be used as a fiducial mark for alignment purposes, in accordance with an aspect of the invention.

In accordance with an aspect of the invention, various ones of the mesas may be different sizes. In accordance with another aspect of the invention, various ones of the mesas may be used to implement functionality other than the supporting function of spacing. FIG. 9 shows mesa 905 made in accordance with the principles of the invention in which is seated ball lens 919, in accordance with an aspect of the invention. FIG. 10 shows mesa 1005 with V-grooves 1021 in respective ones of which are seated optical fibers 1023 in accordance with an aspect of the invention. FIG. 11 shows micro mirrors 1127 between which have been formed long narrow mesas 1125 to function as windbreakers in accordance with an aspect of the invention. This windbreaking function is useful since when one of micro mirrors 1127 is moved it may generate a wind which could affect the positioning of adjacent ones of micro mirrors 127. The windbreaking mesa blocks the wind and prevents the position of the adjacent micro mirror from being disturbed. FIG. 12 shows mesa 1205 into which has been etched pattern 1229, which may be used as a fiducial mark for alignment purposes.

Figure 13:
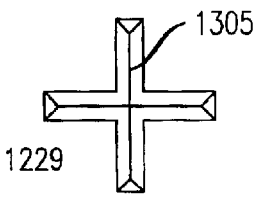
FIG. 13 shows crossed intersecting mesas which can function as a fiducial mark, in accordance with an aspect of the invention.

Note that although the mesas have been shown herein as substantially square in shape, this is for clarity and pedagogical purposes only. In practice, the mesas may have any shape. Thus, FIG. 13 shows crossed intersecting mesas 1305 which can function as a fiducial mark, in accordance with an aspect of the invention.

Figure 14:
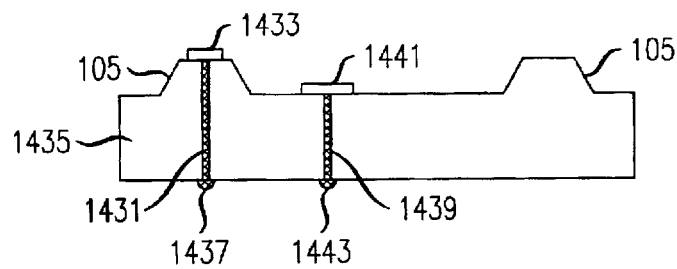
FIG. 14 shows another embodiment of the invention which employs vias.

FIG. 14 shows, in accordance with another embodiment of the invention, via 1431 connecting electrode 1433 through the mesa 105 and substrate 1435 to connection point 1437 as well as via 1439 connecting electrode 1441 though substrate 1435 to connection point 1443.

Figure 15:
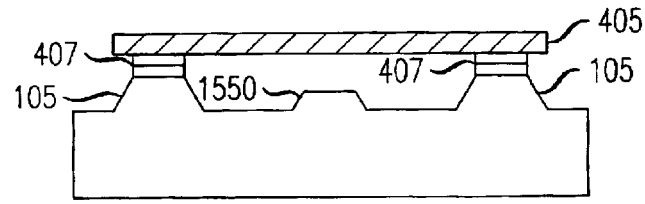
FIG. 15 shows mesas of different heights, in accordance with aspect of the invention.

FIG. 15 shows, in accordance with aspect of the invention, mesas of different heights which are made by removing the mask which was covering any mesa to have less height at a point during the etching process and then resuming etching. Thus, mesas 105 are used as spacers while mesa 1550 is used for another function, such as those described hereinabove.

What is claimed is:

1. A method for making micro-electromechanical systems (MEMS) devices, comprising the steps of:
    etching into a first substrate so as to leave mesas on said first substrate;
    forming circuit elements on the surface area of said first substrate remaining after said etching step;
    forming within a layer at a first surface of a second substrate at least one micro-electromechanical systems (MEMS) structure adapter to be moveable; and
    bonding at least one point of said layer at said first surface of said second substrate to at least one of said mesas of the first substrate.

2. The invention as defined in claim 1 wherein in said step of forming circuit elements said circuit elements are formed only in the etched areas between said mesas.

3. The invention as defined in claim 1 wherein in said step of forming circuit elements at least one of said circuit elements is formed in the etched areas between said mesas.

4. The invention as defined in claim 1 wherein in said step of forming circuit elements at least one of said circuit elements is formed on a surface portion of at least one of said mesas.

5. The invention as defined in claim 1 wherein at least one of said circuit elements is an electrode.

6. The invention as defined in claim 1 further comprising the step of forming within at least one of said mesas one of the group consisting of: (i) a hole, (ii) a via, (iii) a V-groove, and (iv) a pattern.

7. The invention as defined in claim 1 wherein said step of etching mesas into a first substrate further comprises the step of placing a hard mask which defines on said first substrate a desired pattern for said mesas.

8. The invention as defined in claim 7 wherein said hard mask is silicon oxide.

9. The invention as defined in claim 7 wherein at least two mesas are formed and wherein said hard mask is removed from at least one of said at least two mesas partway during said etching step whereby said at least two mesas have different heights.

10. The invention as defined in claim 1 wherein said step of etching mesas into a first substrate further comprises the step of etching any unmasked portion of said first substrate using a mixture of potassium hydroxide (KOH) and isopropanol (IPA).

11. The invention as defined in claim 1 wherein said step of etching into a first substrate further comprises the step of etching any unmasked portion of said first substrate using a mixture of tetramethyl ammonium hydroxide (TMAH) mixed with a surfactant.

12. The invention as defined in claim 11 wherein said surfactant is nonylphenol ethoxy ether.

13. The invention as defined in claim 1 wherein said at least one MEMS structure is a micro mirror.

14. The invention as defined in claim 1 wherein at least one MEM structure comprises a reflecting dielectric stack.

15. The invention as defined in claim 1 further comprising the step of freeing said at least one MEMS structure so that it is free to move.

16. The invention as defined in claim 1 further comprising the step of removing said second substrate so that only said at least one MEMS structure and any supporting structures thereof remain, whereby said at least one MEMS structure is free to move.

17. The invention as defined in claim 1 further comprising the step of removing from said second substrate a sacrificial layer which separates a handle wafer from said MEMS structure so that only said at least one MEMS structure and any supporting structures thereof remain, whereby said at least one MEMS structure is free to move.

18. The invention as defined in claim 1 further comprising the step of removing said second substrate by etching a handle wafer thereof and thereafter etching a sacrificial layer thereof so that only said at least one MEMS structure and any supporting structures thereof remain, whereby said at least one MEMS structure is free to move.

19. The invention as defined in claim 1 wherein said step of forming said at least one MEMS structure further comprises the step of depositing a metal layer on said at least one MEMS structure using a shadow mask whereby metal is deposited substantially only on said at least one MEMS structure and not on any structures surrounding said at least one MEMS structure.

20. The invention as defined in claim 19 further comprises the step of removing said second substrate so that only said at least one MEMS structure and any supporting structures thereof remain, and wherein said metal layer is deposited on the surface of said MEMS structure that faced said removed substrate.

21. The invention as defined in claim 1 further comprising the step of etching through a second surface of said second substrate down to said at least one MEMS structure.

22. The invention as defined in claim 21 further comprising the step of depositing a metal layer on said at least one MEMS structure through a cavity resulting from said etching through said second surface of said second substrate down to said at least one MEMS structure.

23. A micro-electromechanical systems (MEMS) device fabricated in accordance with the process of claim 1.

24. A method for making micro-electromechanical systems (MEMS) devices, comprising the steps of:
    etching into a first substrate so as to leave mesas on said first substrate;
    forming circuit elements on the surface area of said first substrate that remains after said etching step;
    forming at least one micro mirror within a layer at a first surface of a second substrate; and
    bonding at least one point of said layer at said first surface of said second substrate to at least one of said mesas of the first substrate.

25. A method for making micro-electromechanical systems (MEMS) devices, comprising the steps of:
    bonding at least one point of a layer at a first surface of a first substrate in which there is at least one micro-electromechanical systems (MEMS) structure formed to at least a plurality of mesas etched into a second substrate on which there is at least one circuit element on the surface area remaining after creation of said plurality of mesa.

26. A micro-electromechanical systems (MEMS) device comprising:
    mesas protruding from a first substrate after etching of areas of said first substrate which are between said mesas;
    circuit elements formed on said first substrate; and
    a layer from a surface of a second substrate bonded to said mesas of the first substrate, there being at least one moveable micro-electromechanical systems (MEMS) structure formed within said layer.

27. The invention as defined in claim 26 wherein said mesas have different heights.

28. The invention as defined in claim 26 wherein there is at least one via passing through at least one of said mesas.

29. The invention as defined in claim 26 wherein said mesas have an arbitrary shape.

30. The invention as defined in claim 26 wherein at least two of said mesas have different shapes.

31. The invention as defined in claim 26 wherein said MEMS structure is a micro mirror.

32. The invention as defined in claim 26 wherein said circuit elements are electrodes.

33. The invention as defined in claim 26 wherein at least one of said circuit elements is at least within an area between ones of said mesas.

34. The invention as defined in claim 26 wherein at least one of said circuit elements is on at least a surface portion of at least one of said mesas.

35. The invention as defined in claim 26 wherein at least one of said mesas has cut into its top surface at least one of the group consisting of: (i) a V-groove, (ii) a hole, and (iii) a pattern.

36. The invention as defined in claim 26 wherein said at least one moveable micro-electromechanical systems (MEMS) structure comprises a reflecting surface.

* * * * *